(12) United States Patent
Tee et al.

(10) Patent No.: US 11,163,238 B2
(45) Date of Patent: Nov. 2, 2021

(54) OPTIMUM LAYOUT OF DIES ON A WAFER

(71) Applicant: Systems On Silicon Manufacturing Co. Pte. Ltd., Singapore (SG)

(72) Inventors: Seng Jian Tee, Singapore (SG); Seok Chin Phang, Singapore (SG)

(73) Assignee: Systems On Silicon Manufacturing Co. Pte. Ltd., Singapore (SG)

(*) Notice: Subject to any disclaimer, the term of this patent is extended or adjusted under 35 U.S.C. 154(b) by 90 days.

(21) Appl. No.: 16/592,783

(22) Filed: Oct. 4, 2019

(65) Prior Publication Data

US 2021/0103223 A1    Apr. 8, 2021

(51) Int. Cl.
*G06F 30/398* (2020.01)
*G03F 7/20* (2006.01)
*G06F 30/327* (2020.01)

(52) U.S. Cl.
CPC ........ *G03F 7/70433* (2013.01); *G06F 30/327* (2020.01); *G06F 30/398* (2020.01)

(58) Field of Classification Search
CPC ............................ G03F 7/70433; G06F 30/398
USPC .......................................................... 716/55
See application file for complete search history.

(56) References Cited

U.S. PATENT DOCUMENTS

| | | | | |
|---|---|---|---|---|
| 6,016,391 A | * | 1/2000 | Facchini | H01L 22/20 257/E21.525 |
| 6,522,940 B1 | * | 2/2003 | Erck | G03F 7/70433 700/121 |
| 7,033,847 B2 | * | 4/2006 | Tai | G03F 7/70433 438/15 |
| 7,353,077 B2 | * | 4/2008 | Lin | G03F 7/70433 257/E21.525 |
| 8,239,788 B2 | * | 8/2012 | Lin | G03F 7/70433 716/55 |
| 8,386,981 B1 | * | 2/2013 | McGowan | G06F 30/39 716/122 |
| 8,671,381 B1 | * | 3/2014 | Wang | G06F 30/30 716/135 |
| 8,843,860 B2 | * | 9/2014 | Lin | G03F 7/70433 716/54 |
| 9,812,346 B2 | * | 11/2017 | Jang | H01L 23/544 |
| 2004/0128630 A1 | * | 7/2004 | Ward | G03F 7/70433 716/56 |
| 2009/0007028 A1 | * | 1/2009 | Hempel | G03F 7/70433 716/132 |
| 2011/0054659 A1 | * | 3/2011 | Carlson | H01L 21/67253 700/109 |

* cited by examiner

*Primary Examiner* — Suchin Parihar
(74) *Attorney, Agent, or Firm* — Dexter Chin

(57) ABSTRACT

A technique which determines an optimum die layout on a semiconductor wafer is disclosed. The technique determines the optimum die layout with a significantly reduced number of calculations compared to conventional brute force techniques. This enables the generation of the optimum die layout in a much shorter period of time, reducing design turn-around time. The optimum layout is used to process a wafer which produces the optimum number of dies.

20 Claims, 10 Drawing Sheets

OPTIMUM LAYOUT OF DIES ON A WAFER

FIELD OF THE INVENTION

The present disclosure relates to forming semiconductor devices. In particular, the present disclosure relates to generating an optimum die layout on a semiconductor wafer.

BACKGROUND

Semiconductor processing includes forming a plurality of devices in parallel on a wafer. After processing is completed, the wafer is diced along dicing channels to singulate the devices into individual dies. An important consideration in semiconductor processing is the die layout on the wafer. In particular, it is desirable to map the maximum number of dies on the wafer to increase yield and profitability. For example, the more dies that can fit on a wafer, the lower is the cost of the die per wafer.

Conventional techniques for generating wafer maps include a brute force algorithm which calculates positions of the die by using a range of values to get the best value result in the range with a fixed step value. With smaller dies, smaller step values are needed to achieve the best result. For example, if the step value is not sufficiently small, the algorithm may not achieve the optimum wafer map. To ensure capturing of the optimum layout, accuracy of up to 4 decimal places is required. However, as an example, when using a step value of 0.0001 mm, the brute force algorithm will require over 1 billion calculations to determine all permutations of a wafer map for a die having a die size of 4.66 mm×4.43 mm. Such an amount of calculation will take significant time to generate the different permutations of the wafer map required for determining the optimal die layout, even with the most advanced processors.

Accordingly, there is a need to provide an efficient wafer mapping technique to determine the optimal die layout.

SUMMARY

Embodiments of the present disclosure generally relate to determining an optimum die layout on a semiconductor wafer. In one embodiment, the method for fabricating devices on a wafer includes generating a wafer map having an optimum wafer map with an optimum number of devices. A Y shift value on the wafer map is first determined based on an initial horizontal die placement line on which an initial die is placed. The initial horizontal die placement line has an initial y value $y_1$, while y values of other horizontal die placement lines are determined by increasing the initial y value by multiples of a die height (die_height) of dies. X shift values on the wafer map are next determined based on x values of intersection points of horizontal die placement lines located at y locations and an edge exclusion of the wafer (HL/EE intersection points). The optimum wafer map is calculated based on the Y shift value and the X the shift values and the devices on the wafer are fabricated according to the optimum wafer map.

In one embodiment, the method for generating a wafer map of a wafer with an optimum number of dies includes first determining a Y shift value on the wafer map. The Y shift value is based on an initial horizontal die placement line on which an initial die is placed, and the initial horizontal die placement line has an initial y value $y_1$ while the y values of other horizontal die placement lines are determined by increasing the initial y value by multiples of a die height (die_height) of dies. The X shift values on the wafer map are determined based on x values of intersection points of horizontal die placement lines located at y locations and an edge exclusion of the wafer (HL/EE intersection points). An optimum wafer map is calculated based on the Y shift value and the X shift values.

In one embodiment, the device includes a wafer including a plurality of dies disposed within a die region within an edge exclusion of a wafer according to a die layout containing an optimum number of dies. The die layout is first determined from a Y shift value which is based on an initial horizontal die placement line on which an initial die is placed. The initial horizontal die placement line has an initial y value $y_1$ while y values of other horizontal die placement lines are determined by increasing the initial y value by multiples of a die height (die_height) of the dies. The die layout is next determined based on X shift values on the wafer map. The X shift values are based on x values of intersection points of horizontal die placement lines located at y locations and an edge exclusion of the wafer (HL/EE intersection points). The die layout is then determined based on the Y shift value and the X shift value which produce the most number of dies on the wafer map.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 2b shows a process of processing a semiconductor wafer for forming semiconductor devices according to the die layout generated in FIG. 2a;

DETAILED DESCRIPTION

Figure 1A:
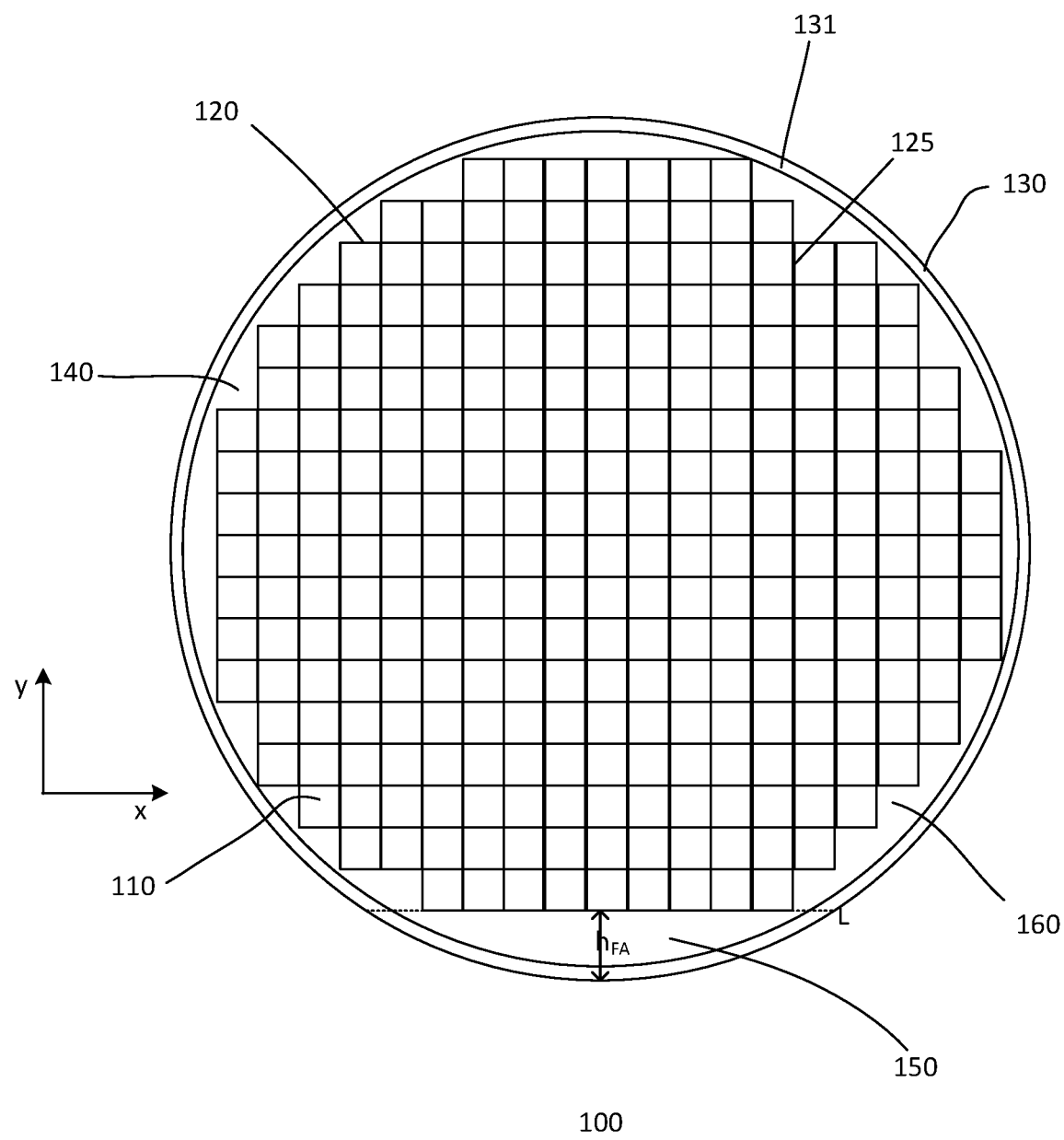
FIG. 1a shows an exemplary embodiment of a semiconductor wafer processed with an optimum die layout.

FIG. 1a shows an exemplary embodiment of a processed semiconductor wafer 100 with an optimum die layout. The wafer includes a wafer edge region 130. The wafer edge region surrounds the die region 140 of the wafer. The wafer edge region and die region are delineated by an edge exclusion 131. The die region, for example, includes processed dies 110 according to an optimum die layout 120. The optimum die layout is generated with a significantly reduced number of calculations while achieving high accuracy, such as 0.0001 mm accuracy. The die layout will include dicing channels 125 in the x and y directions which separate adjacent dies.

The die layout is disposed above a flat area 150. The flat area, for example, is located at a bottom or lower portion of the wafer and is devoid of dies. The flat area is a pre-defined area. The size of the flat area may be defined as having a height $h_{FA}$ from the edge of the wafer to the center point. Typically, $h_{FA}$ is about 9 mm. Providing flat areas having other $h_{FA}$ values may also be useful. The flat area is the same for all types of wafers. For example, wafers for different types of dies or having different die sizes have the same size flat area. A line L delineates the flat area and the die area.

Due to the fact that the wafer is circular and the dies are rectangular, there are empty spaces 160 at the periphery of the die region. For example, the empty spaces are insufficient to contain a full die. As shown, the empty spaces are devoid of dies. In some cases, the empty spaces may include partial dies. However, these are only partial dies and are unusable.

Figure 1B:
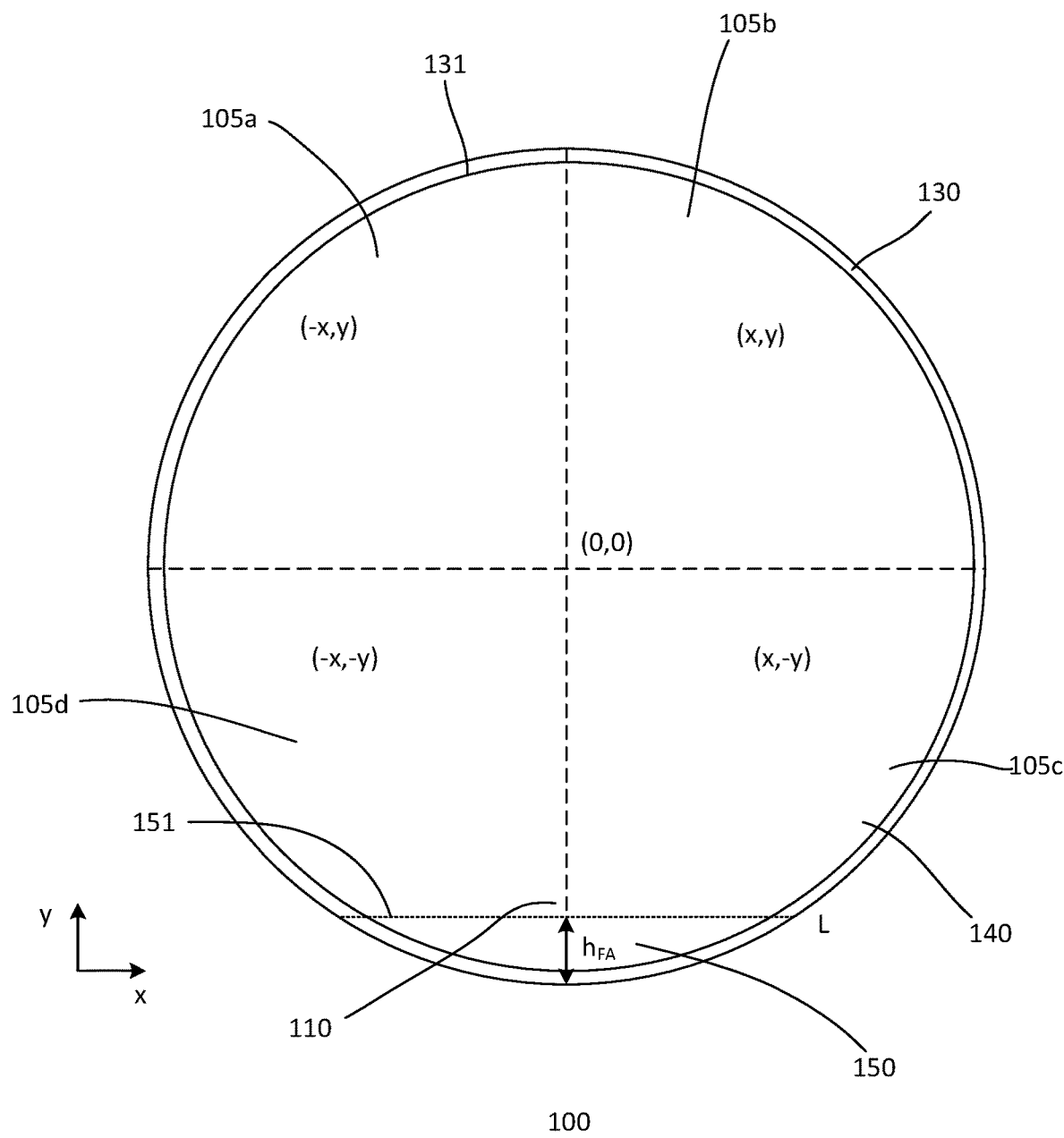
FIG. 1b shows an exemplary wafer map of a blank wafer.

FIG. 1b illustrates a wafer map 100 of a blank wafer. The wafer map, as shown, is separated into four quadrants 105a-105d. Any point on the wafer map can be designated by x and y coordinates (x,y). The center of the wafer is designated by coordinates (0,0). For example, both the x and y coordinates of the point at the center of the wafer are equal to zero. The top half of wafer map (first and second quadrants) is designated with a positive y coordinate while the lower half of the wafer map is designated with a negative y coordinate. The left half of the wafer map is designated with a negative x coordinate while the right half of the wafer map is designated with a positive x coordinate. In other words, a point in the first quadrant is designated by (−x,y), a point in the second quadrant is designated by (x,y), a point in the third quadrant is designated by (−x,−y) and a point in the fourth quadrant is designated by (x,−y).

As shown, the wafer map includes a wafer map die region 140 surrounded by a wafer map edge region 130. The wafer map also includes a wafer map flat region 150. The wafer map flat area region and wafer map die region are delineated by a flat area horizontal line 151 along the x direction. The flat area has a peak height $h_{FA}$, as indicated by the arrow. As such, the flat area horizontal line has a y value which is $y_{FA}=-(r-h_{FA})$, where r is the radius of the wafer. Since the flat area horizontal line is located on the lower half of the wafer map and $h_{FA}$ is less than the length of the radius, $y_{FA}$ has a negative value.

Figure 2A:
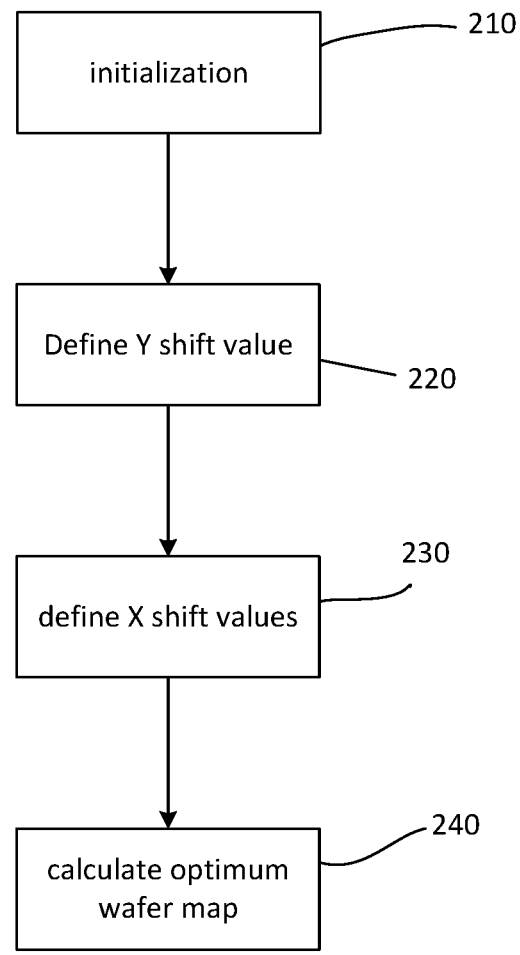
FIG. 2a shows an embodiment of a process for determining a die layout on a semiconductor wafer.

FIG. 2a shows an embodiment of a process 200a for generating an optimum die layout for a wafer. The process, for example, may be embodied as a software application which is executed by a computer for calculating the optimal die layout of a wafer. For example, the software generates a wafer map with the optimum number of dies. The computer may include a display which displays the wafer map with the optimum number of dies.

At 210, the process commences by performing initialization. Initialization defines the information required for subsequent calculation and includes providing baseline information, such as die size and wafer size. The wafer size should take into account the edge region of the wafer. For example, the wafer size is based on the die region of the wafer without the edge region.

At 220, the process continues to define a shift value for the y direction (Y shift value). The Y shift value is based on y locations of the horizontal lines (along the x direction) on the wafer map on which dies are disposed (horizontal die placement lines). Any point on a horizontal die placement line will have the same y value but different x values. In one embodiment, the Y shift value is associated with y locations of the horizontal die center lines corresponding to the centers of the dies on the horizontal die placement lines. In one embodiment, the Y shift value corresponds to the y value of the horizontal die center line closest to the center of the wafer.

To define the Y shift value of the wafer map, in one embodiment, an initial die is placed above a flat area 150. For example, the initial die is placed on or close to the flat area horizontal line delineating the flat area and the die area. In one embodiment, the flat area horizontal line serves as the first horizontal die placement line of the wafer map on which the initial die is placed. The y value of the first horizontal die placement line may be designated as $y_1$. In the case where the first horizontal die placement line is the flat area horizontal line, $y_1$ is equal to $y_{FA}$.

Y values of other horizontal die placement lines can be determined from $y_1$. In one embodiment, y values of other horizontal die placement lines are equal to $y_1$ incremented by multiples of the die height of the dies. It is understood that the die height takes into account the dicing channels. For example, the die height is equal to the height of the active area of the die plus the width of 1 dicing channel (half of the width of the dicing channel at the top of the die and half the width of the dicing channel at the bottom of the die). In the case where the wafer includes m number of horizontal die placement lines, the first horizontal die placement line has a y value equal to $y_1$ while they value of the last horizontal line, which is $y_m$, is equal to $y_1+((m-1)\times(\text{die height}))$. The last horizontal die placement line is the last horizontal line which can accommodate a complete die. For example, they value of the m+1 line is greater than the positive value of the radius of the wafer.

As discussed, in one embodiment, the Y shift value is associated with the y values of the centers of the dies disposed on the horizontal die placement lines (horizontal die center lines). The y values of the horizontal die center lines can be determined by determining the y value of the first horizontal die center line $y_{c1}$, which is equal to $y_1$ plus half of the die height. For example, $y_{c1}=y_1+\frac{1}{2}$ die height. Y values of other die center lines can be calculated by incrementing $y_{c1}$ by multiples of the die height, similar to calculating other horizontal die center lines. In one embodiment, the Y shift value is equal to the horizontal die center line which is closest to the wafer center.

After defining the Y shift values, the process at 230 continues to define shift values for the x direction (X shift values). X shift values are based on the intersection points of horizontal die placement lines and the edge exclusion (HL/EE intersection points) on the wafer map. An HL/EE intersection point can be determined by the following equation:

$$X=\sqrt{r^2-y^2} \qquad \text{(Equation 1)}$$

where,
X is x value of the intersection point of HL/EE,
r is the radius of the wafer, and
y is the y value of the horizontal line.

In one embodiment, X shift values are based on the dies intersecting the HL/EE intersection points of the wafer map. For example, X shift values are based on the placement of dies for each quadrant of the wafer map and determining the HL/EE intersection points of the dies. The X shift values are based on the x location of where the vertices of the dies intersect the HL/EE intersection point. Depending on the quadrant, different vertices of the dies intersect at the HL/EE intersection points.

In one embodiment, the X shift values correspond to the x value of the centers of dies intersecting the HL/EE intersection points. The x values of the die centers can be calculated by x locations of the intersection points and shifting them by half of the die width. The shifting may be positive or negative, depending on the wafer quadrant. For example, quadrants on the right half of the wafer map may have a negative shift while quadrants on the left half of the wafer may have a positive shift. Using the defined Y shift value and X shift values, the process at 240 calculates an optimum wafer map which contains the highest number of dies. This can be achieved by calculating the die layout based on the Y shift value and each X shift value to determine the number of dies of the respective layout. The X shift value which yields the highest number of dies is the optimum die layout.

Figure 2B:
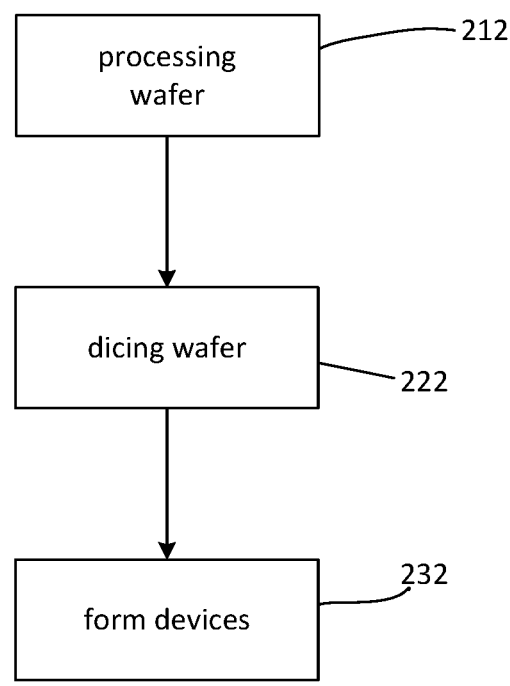

FIG. 2b shows an embodiment of a process 200b for forming devices. At 212, a wafer is processed to form a plurality of devices according to the optimum wafer map generated in FIG. 2a. For example, the dies are disposed on the wafer according to the optimum wafer map to produce the maximum number of dies.

Processing the wafer includes numerous processes, such as ion implantation using a patterned resist mask, patterning a deposited layer by a patterned mask, planarizing a wafer surface by chemical mechanical polish (CMP) to form a planar. To form patterned masks used in the various processes, photolithography is performed. Photolithography includes exposing a resist layer on a wafer surface with an exposure source using a reticle with the desired pattern. The resist layer is developed to transfer the reticle pattern to the resist layer. The reticle includes the pattern for one die. The exposure source repeatedly exposes the resist layer on the wafer die for one die according to the optimum wafer map. Typically, numerous reticles are required in completing the processing of a wafer. For example, various processes may be repeatedly performed using different reticles until wafer processing is complete.

After wafer processing is completed at 222, the wafer is diced along the dicing channels between dies to singulate the dies. The process continues at 232 to complete forming the devices. For example, the singulated dies may be packaged to form individual chips or devices.

Figure 3:
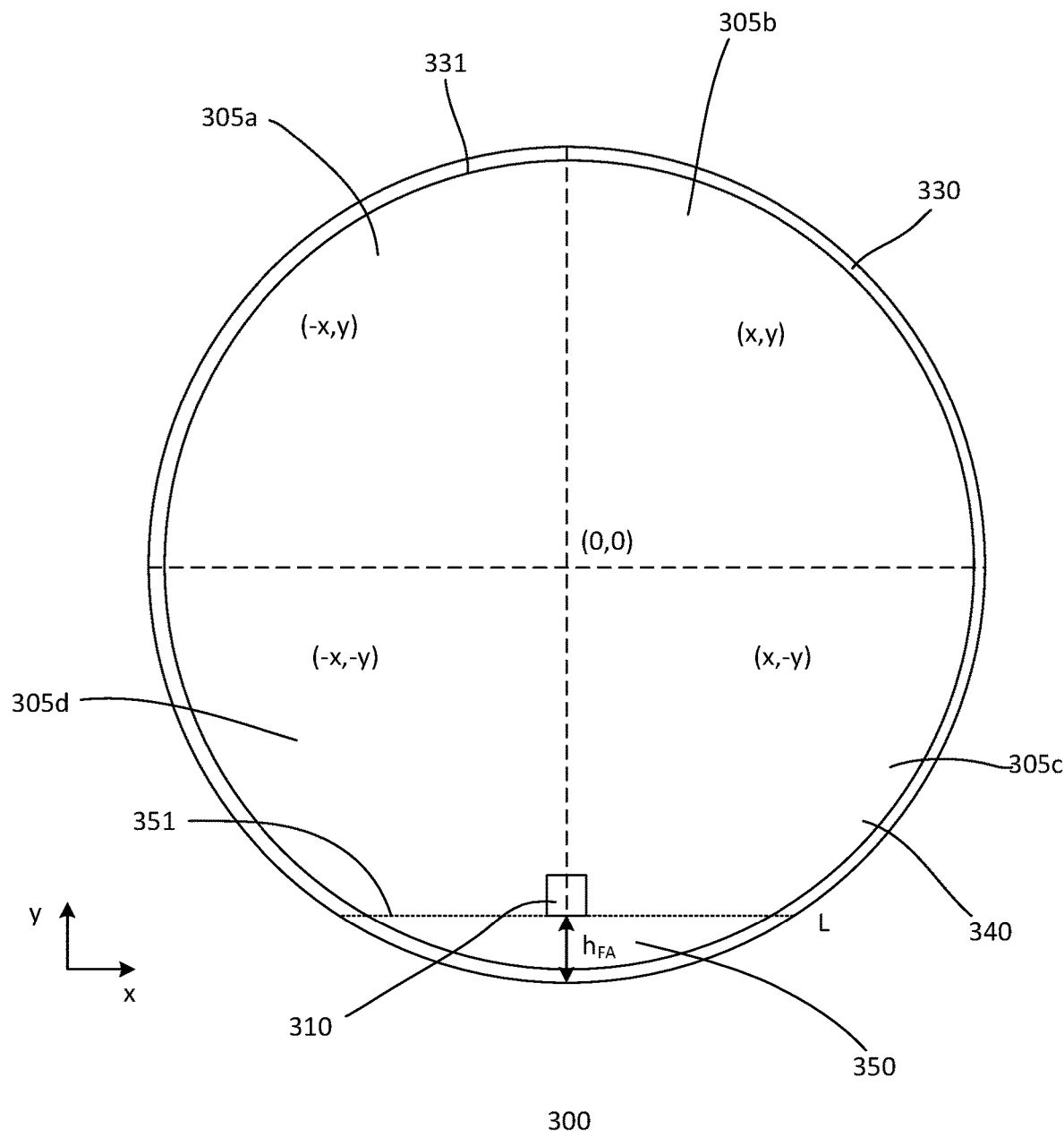
FIG. 3 illustrates an initial process for determining a die layout on a wafer.

FIG. 3 illustrates a wafer map 300 according to the initialization of the process of FIG. 2a. The wafer map, as shown, is similar to that described in FIG. 1b. Common elements may not be described or described in detail.

In one embodiment, the process places an initial die 310 on is placed above the flat area, taking into consideration that the placement should minimize the gap between the die and the flat area. For example, the initial die is placed as close to the flat area horizontal line 351 as possible to minimize the gap between the die and the flat area. Preferably, the initial die is placed on the flat area horizontal line. For example $y_1 = y_{FA}$, which is equal to $-(r-h_{FA})$. The initial die can be placed anywhere on the horizontal line. Also, as previously discussed, $y_{FA}$ has a negative value.

Figure 4:
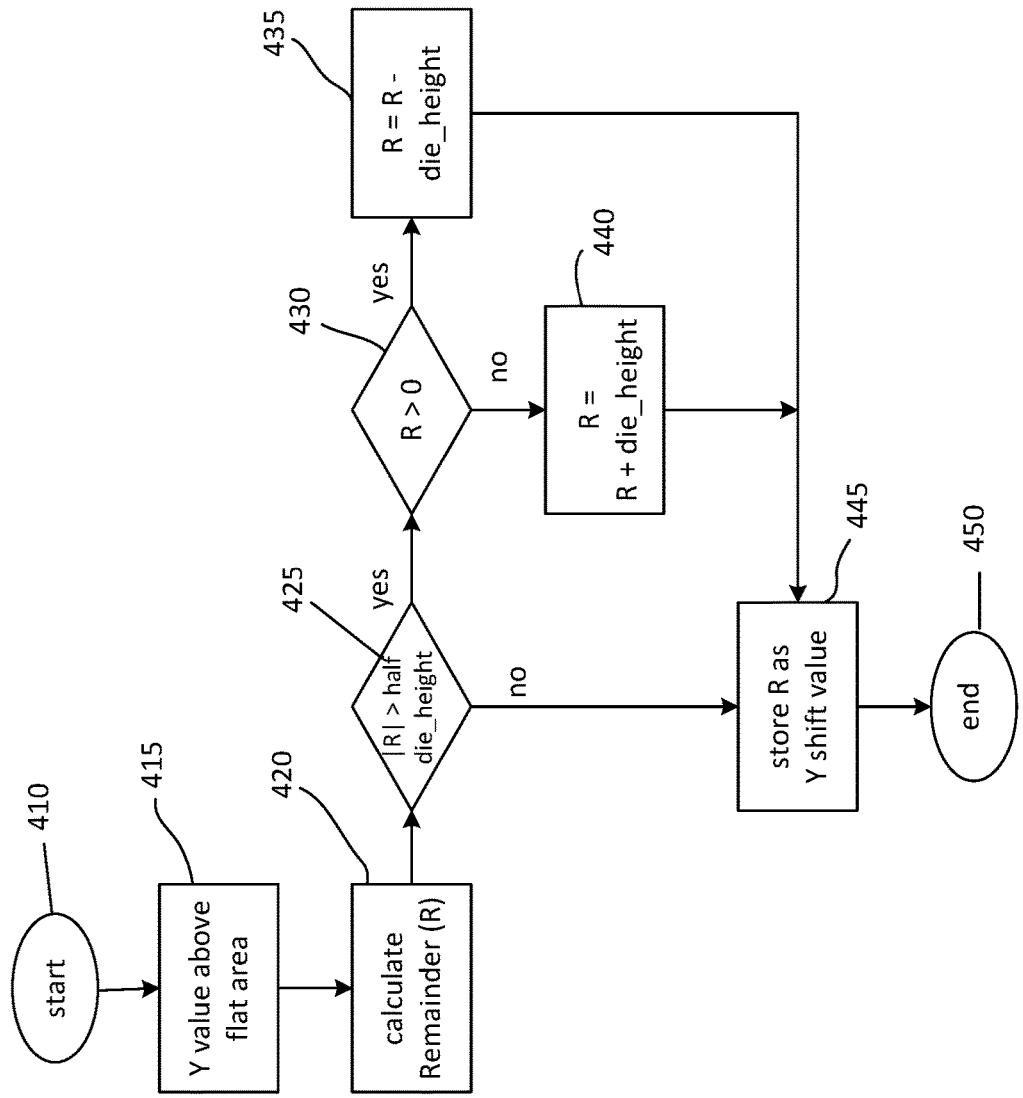
FIG. 4 shows an embodiment of a process for determining the shift value Y.

FIG. 4 shows an embodiment of a process 400 for determining the Y shift value. At 410, the process commences. For example, a user initiates the process to generate the optimum wafer map. This includes, as discussed, providing die region (edge exclusion) size, die size, flat area size and initial die location. At 415, the process determines the first Y shift value above the flat area. For example, the first Y shift value corresponds to the first horizontal line of the wafer map. In one embodiment, the process determines the first Y shift value above the flat area and below the lower half of the wafer map. The first Y shift value above the flat area and below the lower half of the wafer map can be defined by equation 2 below:

$$y = -(\text{radius} - h_{FA}) \quad \text{(Equation 2)}$$

where,
radius = the radius of the wafer,
$h_{FA}$ = the peak height of the flat area, and
y = the value of the y coordinate defining a y location of the wafer map.

In addition, the process derives the y value at the center of the initial die according to the die placement on the wafer map. The y value at the die center is derived using y as follows:

$$\text{die\_center\_}Y = y + (\text{die\_height}/2) \quad \text{(Equation 3)}$$

where,
die_center_Y = the center of the die,
$y = -(\text{radius} - h_{FA})$, and
die_height/2 = half the height of the die.

The height of a die includes the dicing channels. The die center Y is used to determine the relative die center placement at the wafer center.

The process continues to calculate the remainder (R) at 420. The remainder is determined as follows:

$$R = \text{die\_center\_}Y \% \text{ die\_height}, \quad \text{(Equation 4)}$$

where,
die_height is equal to the height of the die, and
%=MOD.

As an example, assume that 9 is divided by 4, which is equal to 4 with a remainder of 1. In the case of 9MOD4, it is equal to 1. In the case where the die center y is −90 and the die height is 5, then the die center y of the die above the die center y of −90 is −85. This is used to determine the y value of the center of the die which is closest to the wafer center. For example, the die center with the y value closest to 0 is closest to the wafer center. The value of die center line closest to wafer center is always +−(die height/2). For example, when the die height=5, the value of the die center line closest to the wafer center should be between the range of −2.5 to 2.5.

At 425, the process determines if the absolute value of R is greater than half the die height. For example, the process determines if |R|>(die_height/2). If |R| is not greater than die_height/2, than |R| is stored in the system as a Y shift value at 445. The Y shift value may be stored in, for example, a storage unit of the system, such as a hard drive or other types of storage units for storing data.

If |R| is greater than half the die height, the process continues to 430, where it determines if R is greater than 0 or not. If R is not greater than 0, the process increases R with the height of the die at 440. For example, R=R+die_height. The increased R is then stored at 445 as the shift value Y. On the other hand, if R is greater than 0, the process reduces R by subtracting the die height from R at 435. For example, R=R−die_height. The reduced R is then stored as the Y shift value at 445. After determining and storing the Y shift value, the process terminates at 450.

Figure 5:
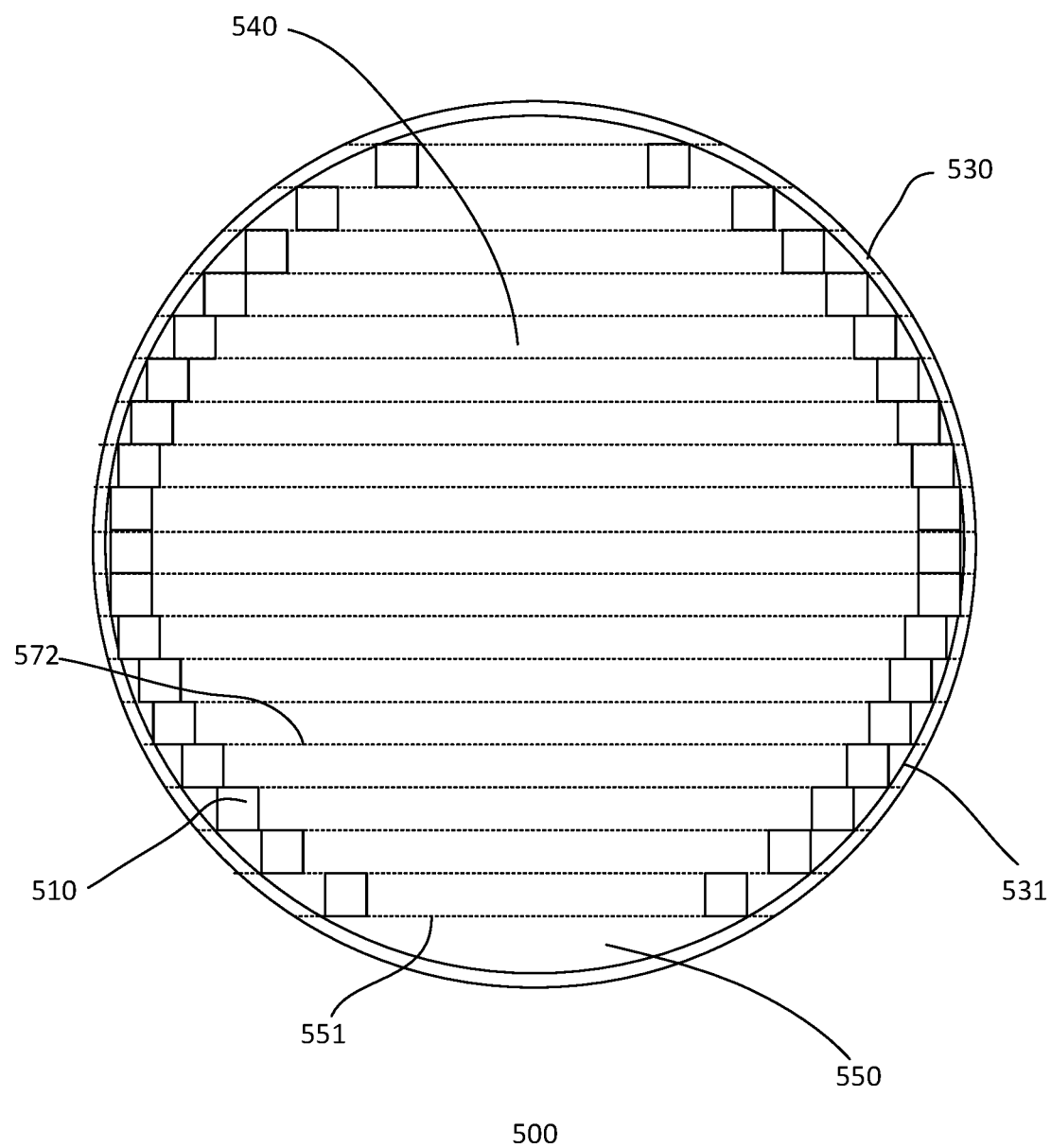
FIG. 5 illustrates an embodiment of a wafer map with die placement for calculating shift value X.

FIG. 5 shows a wafer map 500 with horizontal die placement lines 572. The wafer map, as shown, includes an edge exclusion line 531 delineating the edge region 530 and the die region 540 of the wafer. Horizontal die placement lines 572 are placed on the wafer map at y values. For example, they values of the horizontal die placement lines are based on the y value of the initial horizontal die placement line, such as the flat area horizontal line. The y values of the horizontal lines are calculated for the wafer map, starting from the flat area horizontal or delineation line 551. For example, the flat area delineation line serves as the first horizontal die placement line. The y values of subsequent horizontal die placement lines are determined by incrementing y value of the flat area delineation line by factors of the die height. The y value of the last horizontal die placement line is the one which is the last horizontal line on which complete dies can be placed. Once the y values of the horizontal line values are determined, the process calculates the HL/EE intersection points for placement of dies. Dies 510 are disposed on the horizontal lines which intersect at HL/EE intersection points. As shown, dies are placed on the horizontal lines, with appropriate vertices of the dies at the HL/EE intersection points. The appropriate vertices depend on the quadrant of the wafer on which the dies are located.

Figure 6:
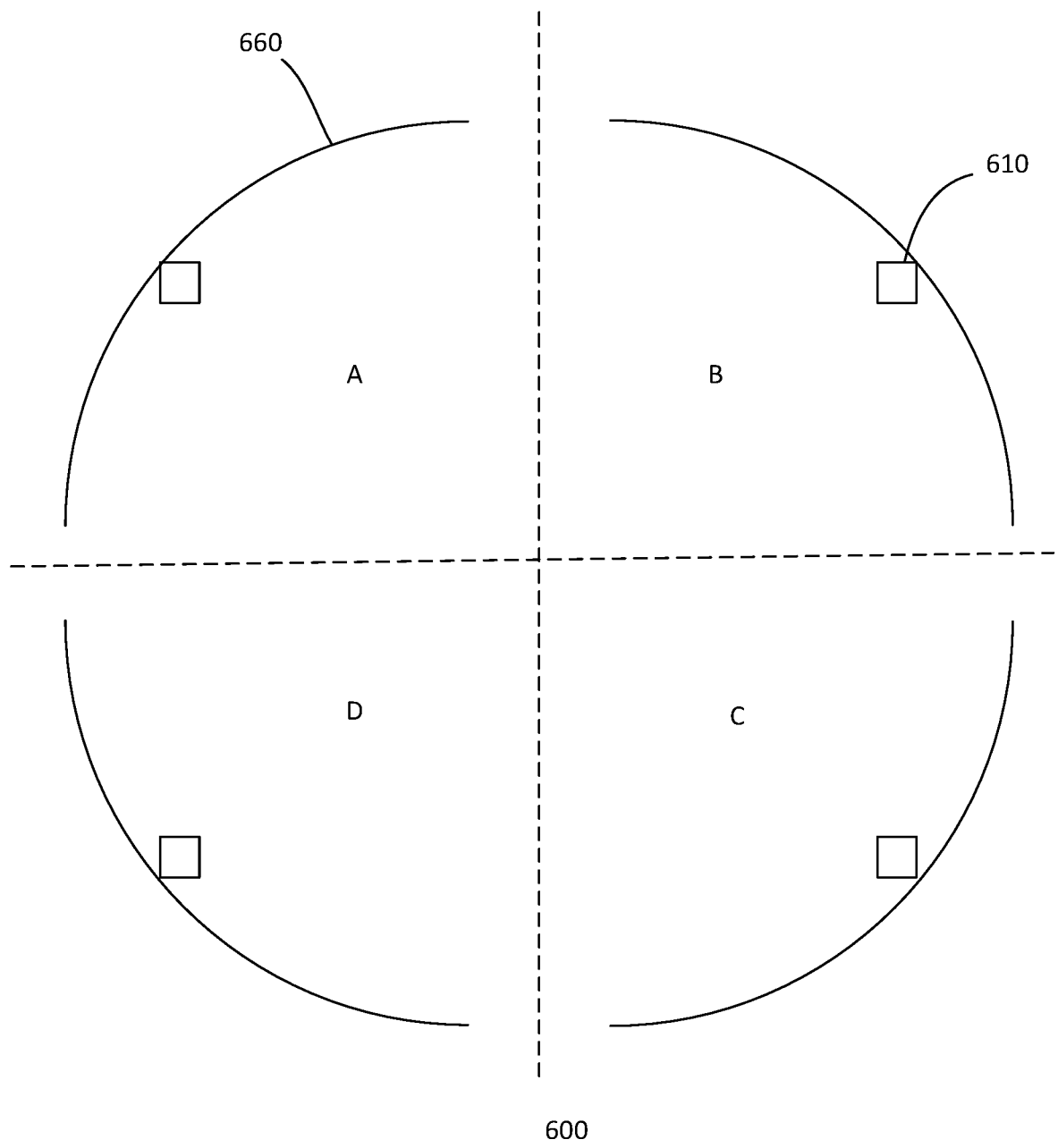
FIG. 6 illustrates an embodiment of die placement for each quadrant of a wafer map.

FIG. 6 illustrates an embodiment of a segmented wafer map 600. As shown, the wafer map is segmented into four quadrants A-D. Dies 610 are placed at the intersection points of the edge exclusion line 660 and the horizontal lines. Dies placement for each quadrant will be different. In one embodiment, the die vertices of each corresponding die are placed at the HL/EE intersection points to ensure that complete dies can be generated.

Figure 7:
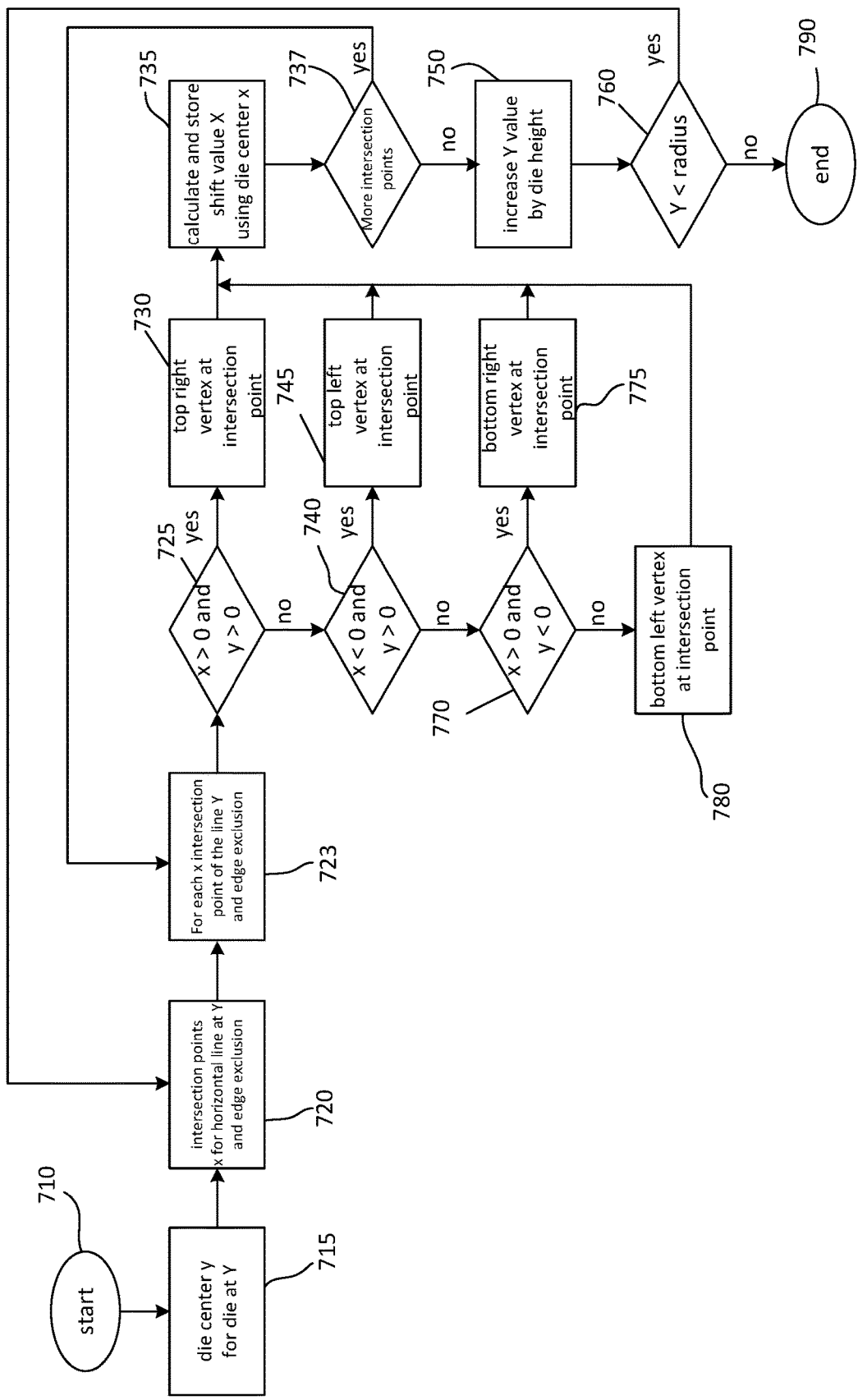
FIG. 7 shows a process of an embodiment for defining shift value X.

FIG. 7 shows an embodiment of a process 700 for calculating possible x shift values used to generate the optimal die layout. The process commences at 710. At 715, the process obtains the y value of the die center at the first Y shift value. The process continues to 720 where it calculates x values of the intersection points of the horizontal line at Y and the edge exclusion. Please note that a horizontal line has two intersection points, one at negative x half of the wafer map and another at the positive x half of the wafer map. At 723, each intersection point of the horizontal line Y and the edge exclusion is processed.

The process continues by determining the quadrant of the wafer map in which an intersection point of the horizontal line at Y and the edge exclusion is located. For example, at 725, if both x and y values of the intersection point are positive, it is located in the top right quadrant of the wafer map. At 730, the process determines the intersection point of the top right vertex of the die and the edge exclusion and then continues to 735.

If both x and y values of the intersection point of the horizontal line at Y and the edge exclusion are not positive, the process proceeds to 740 where it determines if x is negative and y is positive. If x is negative and y is positive, the intersection point is located in the top left quadrant of the wafer may. At 745, the process determines the intersection point of the top left vertex of the die and edge exclusion and then continues to 735.

If x is not negative or y is not positive, the process proceeds to 770. If x is positive and y is negative, the intersection point of the horizontal line at Y and the edge exclusion is located in the bottom right quadrant of the wafer may. At 775, the process determines the intersection point of the bottom right vertex of the die and edge exclusion and then continues to 735.

If both x is not positive and y is not positive, the process proceeds to 780. This leaves the situation where x and y are both negative, indicating that the intersection point of the horizontal line at Y and the edge exclusion is located in the bottom left quadrant of the wafer map. The process determines the intersection point of the bottom left vertex of the die and edge exclusion and proceeds to 735.

At 735, the process calculates the X shift value of the die using the x value of the die at the die center. The X shift value is calculated for the intersection points of the horizontal line at Y and the edge exclusion. The X shift values are stored, for example, in memory of the computer.

The process continues by determining if there is another x intersection point for the horizontal line at Y and the edge exclusion to be processed at 737. If there is, the process returns to 723 to process the other x intersection point. If not, the process continues to 750 to determine if there are more X shift values to calculate. For example, Y is increased by the die height. The process, at 760 compares Y with the value of the radius Rw of the wafer map. If Y<Rw, this indicates that there are more X shift values to calculate. The process then returns to 720. On the other hand, if Y is not greater than Rw, the process terminates at 790.

As described, the process determines the X shift values based on the x value at the center of the die at a horizontal die placement line which intersects the edge exclusion. Using other die reference points to determine the X shift values may also be useful.

Figure 8:
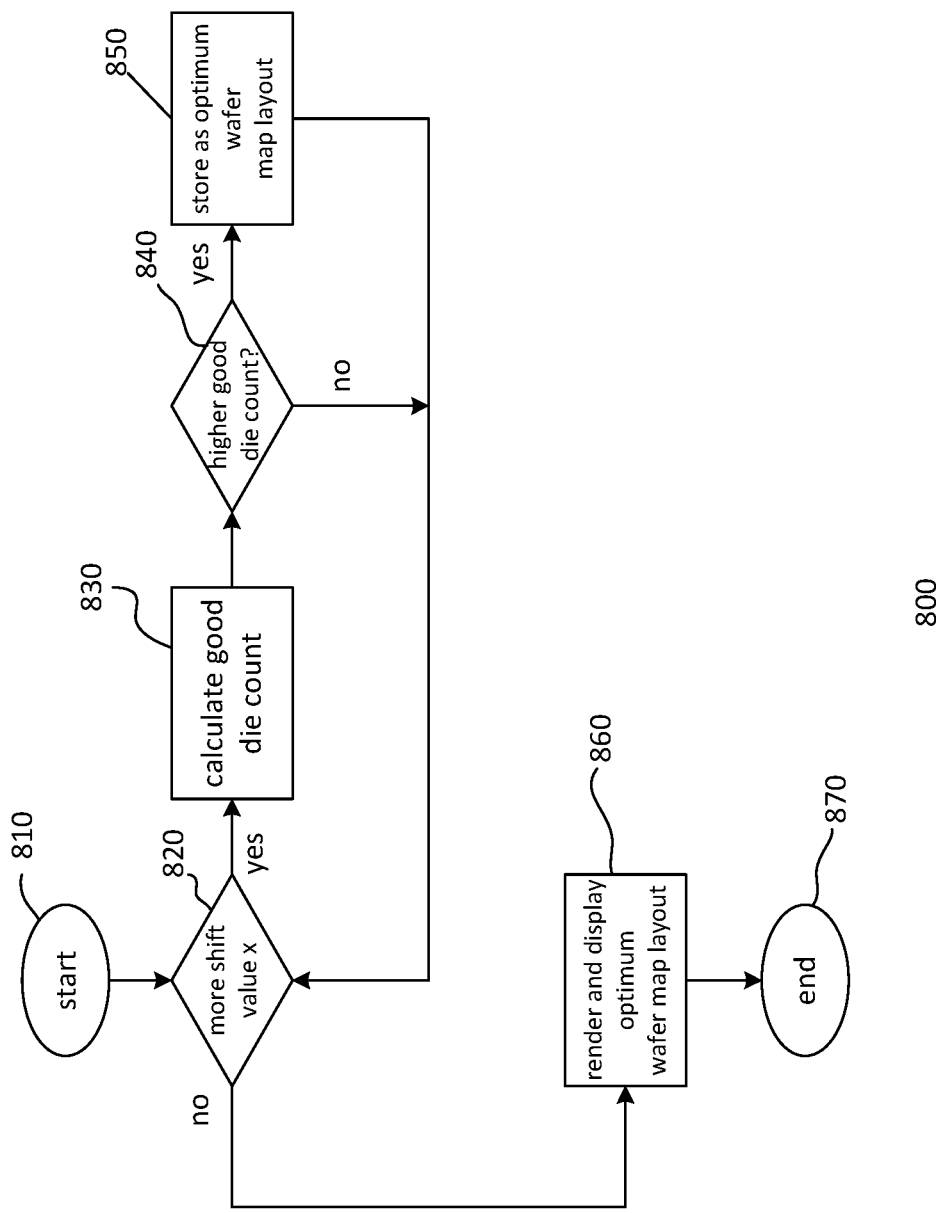
FIG. 8 shows a process for determining a wafer map with an optimum die layout.

FIG. 8 shows a process 800 for generating an optimum wafer map. The process utilizes the X shift values determined by the process of FIG. 7. The process commences at 810. Commencement of the process includes performing initialization. Initialization includes, for example, retrieving the X shift values and the Y shift value stored in the system. At 830, for each shift value X based on the Y shift value, the process calculates the good die count for the wafer map. For example, in the first iteration, the process calculates the number of good die count for the first shift value X of the retrieved X shift value based on the retrieved Y shift value. At 840, the process determines if there is a higher die count that exists from a previous iteration. If there is a higher die count from a previous iteration, the process continues to 820. If there is no higher die count, meaning that this die count is the highest, the process proceeds to 850, which stores the mapping using the current shift value X as the optimum wafer map layer. The process then proceeds to 820. At 820, the process determines if there are more X shift values to analyze. If there are, the process proceeds to 830. The process repeats until there are no more X shift values to analyze. At such point, the process may proceed to 860. At 860, the system renders and displays the optimum wafer map layer which produces the most number of dies.

As described, the process generates the optimum wafer map by determining the Y shift values which relates to the horizontal lines. The X shift values are determined by calculating the intersection points of the vertices of the dies with the edge line and horizontal lines. This results in the generation of an optimum wafer map with significantly fewer calculations compared to conventional techniques.

The invention may be embodied in other forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for fabricating devices on a wafer comprising:
    generating a wafer map which is an optimum wafer map with an optimum number of devices comprising:
        determining a Y shift value on the wafer map, wherein the Y shift value is based on an initial horizontal die placement line on which an initial die is placed, wherein the initial horizontal die placement line is placed on a flat area horizontal line having an initial y value $y_1$ which is the same for all types of wafers, wherein y values of other horizontal die placement lines are determined by increasing the initial y value by multiples of a die height (die_height) of dies,
        determining X shift values on the wafer map, wherein the X shift values are based on x values of intersection points of horizontal die placement lines located at y locations and an edge exclusion of the wafer (HL/EE intersection points),
        calculating the optimum wafer map based on the Y shift value and the X shift values; and
    fabricating devices on the wafer according to the optimum wafer map.

2. The method of claim 1, wherein when the initial die is placed on the flat area horizontal line, the initial y value $y_1$ is equal to $-(R_w - h_{FA})$,
    wherein
    $R_w$=a radius of the wafer map,
    $h_{FA}$=a height of a wafer map flat area which is determined from an edge bottom of the wafer to a center point of the wafer, and
    wherein the flat area horizontal line delineates the wafer map flat area from a wafer map die region.

3. The method of claim 2, wherein the height $h_{FA}$ is the same for all types of wafers, including wafers for different types of dies or different die sizes.

4. A method for fabricating devices on a wafer comprising:
    generating a wafer map which is an optimum wafer map with an optimum number of devices comprising:
        determining a Y shift value on the wafer map, wherein the Y shift value is based on an initial horizontal die placement line on which an initial die is placed, wherein the initial horizontal die placement line has an initial y value $y_1$, wherein y values of other horizontal die placement lines are determined by increasing the initial y value by multiples of a die height (die_height) of dies, wherein the Y shift value is further based on horizontal die center lines of dies placed on the horizontal die placement lines, wherein the initial value of horizontal die center line $y_{c1}$ is equal to $y_1 + (1/2 \times (\text{die\_height}))$;
        determining X shift values on the wafer map, wherein the X shift values are based on x values of intersection points of horizontal die placement lines located at y locations and an edge exclusion of the wafer (HL/EE intersection points),
        calculating the optimum wafer map based on the Y shift value and the X shift values; and
    fabricating devices on the wafer according to the optimum wafer map.

5. The method of claim 4, wherein the Y shift value corresponds to a y value of the horizontal die center line closest to a center of the wafer ($y_{ccw}$).

6. The method of claim 4, wherein determining the Y shift value comprises:
    calculating a remainder value R, wherein $R = y_{c1} \% \text{die\_height}$;
    if $|R| \le (\text{die\_height}/2)$, then the Y shift value=$|R|$;
    if $|R| > (\text{die\_height}/2)$ and $R \le 0$, then the Y shift value=$R + \text{die\_height}$; and
    if $|R| > (\text{die\_height}/2)$ and $R > 0$, then the Y shift value=$R - \text{die\_height}$.

7. The method of claim 1, wherein the X shift values are associated with x values of centers of the dies at the HL/EE intersection points.

8. The method of claim 1, wherein:
    the HL/EE intersection points of the dies in a top right quadrant of the wafer map comprise top right vertices of the dies;
    the HL/EE intersection points of the dies in a top left quadrant of the wafer map comprise top left vertices of the dies;
    the HL/EE intersection points of the dies in a bottom right quadrant of the wafer map comprise bottom right vertices of the dies; and
    the HL/EE intersection points of the dies in a bottom left quadrant of the wafer map comprise bottom left vertices of the dies.

9. The method of claim 1, wherein determining the X shift values comprises:
    calculating the x values of the HL/EE intersection points associated with the horizontal die placement line located at a y location, wherein $x = \sqrt{r^2 - y^2}$;
    verifying a quadrant location of each of a pair of the x and y values of the HL/EE intersection points; and
    calculating the X shift values for each of the pair of the x and y values of the HL/EE intersection points using x values of centers of the dies at the HL/EE intersection points.

10. The method of claim 9, wherein determining the X shift values further comprises:
    calculating other y locations by increasing previous y location by the die height; and
    determining the X shift values based on the x values of the HL/EE intersection points associated with the horizontal die placement line located at each of the other y locations when the other y locations is smaller than a radius of the wafer map $R_w$.

11. The method of claim 1, wherein calculating the optimum wafer map comprises:
    calculating die counts for each of the X shift values associated with the Y shift value; and
    using the Y shift value and a X shift value which provides a highest die count for the optimum wafer map.

12. The method of claim 1, wherein the generating of the wafer map can be performed through executing instructions embodied in a non-transitory computer-readable media, wherein the instructions are executed by a machine configured to be operative with the non-transitory computer-readable media.

13. A wafer comprising:
    a plurality of dies disposed within a die region within an edge exclusion of a wafer according to a die layout containing an optimum number of dies; and
    wherein the die layout is determined from
        a Y shift value which is based on an initial horizontal die placement line on which an initial die is placed, wherein the initial horizontal die placement line is placed on a flat area horizontal line having an initial y value $y_1$ which is the same for all types of wafers, wherein y values of other horizontal die placement lines are determined by increasing the initial y value by multiples of a die height (die_height) of the dies, X shift values on the wafer map, wherein the X shift values are based on x values of intersection points of horizontal die placement lines located at y locations and an edge exclusion of the wafer (HL/EE intersection points), and the Y shift value and a X shift value which produce the most number of dies on the wafer map.

14. The wafer of claim 13, wherein when the initial die is placed on the flat area horizontal line, the initial y value $y_1$ is equal to $-(R_w - h_{FA})$, wherein $R_w$ = a radius of the wafer map, $h_{FA}$ = height of a wafer map flat area which is determined from an edge bottom of the wafer to a center point of the wafer, and wherein the flat area horizontal line delineates the wafer map flat area from the die region.

15. The wafer of claim 14, wherein the height $h_{FA}$ is the same for all types of wafers, including wafers for different types of dies or different die sizes.

16. A wafer comprising:

a plurality of dies disposed within a die region within an edge exclusion of a wafer according to a die layout containing an optimum number of dies; and wherein the die layout is determined from a Y shift value which is based on an initial horizontal die placement line on which an initial die is placed, wherein the initial horizontal die placement line has an initial y value $y_1$, wherein y values of other horizontal die placement lines are determined by increasing the initial y value by multiples of a die height (die_height) of the dies, wherein the Y shift value is further based on horizontal die center lines of dies placed on the horizontal die placement lines, wherein an initial value of a horizontal die center line $y_{c1}$ is equal to $y_1 + (1/2 \times die\_height)$), X shift values on the wafer map, wherein the X shift values are based on x values of intersection points of horizontal die placement lines located at y locations and an edge exclusion of the wafer (HL/EE intersection points), and the Y shift value and a X shift value which produce the most number of dies on the wafer map.

17. The wafer of claim 16, wherein determining the Y shift value comprises:

calculating a remainder value R, wherein $R = y_{c1} \% die\_height$;

if $|R| \leq (die\_height/2)$, then the Y shift value = $|R|$;

if $|R| > (die\_height/2)$ and $R \leq 0$, then the Y shift value = $R + die\_height$; and if $|R| > (die\_height/2)$ and $R > 0$, then the Y shift value = $R - die\_height$.

18. The wafer of claim 13, wherein determining the X shift values comprises:

calculating the x values of the HL/EE intersection points associated with the horizontal die placement line located at a y location, wherein $x = \sqrt{r^2 - y^2}$;

verifying a quadrant location of each of a pair of the x and y values of the HL/EE intersection points; and calculating the X shift values for each of the pair of the x and y values of the HL/EE intersection points using x values of centers of the dies at the HL/EE intersection points.

19. The wafer of claim 18, wherein determining the X shift values further comprises:

calculating other y locations by increasing previous y location by the die height; and determining X shift values based on x values of the HL/EE intersection points associated with the horizontal die placement line located at each of the other y locations when the other y locations is smaller than a radius of the wafer $R_w$.

20. A method for generating a wafer map of a wafer with an optimum number of dies comprising:

determining a Y shift value on the wafer map, wherein the Y shift value is based on an initial horizontal die placement line on which an initial die is placed, wherein the initial horizontal die placement line is placed on a flat area horizontal line having an initial y value $y_1$ which is the same for all types of wafers, wherein y values of other horizontal die placement lines are determined by increasing the initial y value by multiples of a die height (die_height) of dies;

determining X shift values on the wafer map, wherein the X shift values are based on x values of intersection points of horizontal die placement lines located at y locations and an edge exclusion of the wafer (HL/EE intersection points); and calculating an optimum wafer map based on the Y shift value and the X shift values.

* * * * *